(12) United States Patent
Maleville

(10) Patent No.: US 8,216,917 B2
(45) Date of Patent: Jul. 10, 2012

(54) METHOD FOR FABRICATING A SEMICONDUCTOR ON INSULATOR TYPE SUBSTRATE

(75) Inventor: Christophe Maleville, La Terrasse (FR)

(73) Assignee: Soitec, Bernin (FR)

( * ) Notice: Subject to any disclaimer, the term of this patent is extended or adjusted under 35 U.S.C. 154(b) by 177 days.

(21) Appl. No.: 12/863,904

(22) PCT Filed: Jan. 29, 2009

(86) PCT No.: PCT/EP2009/050994
§ 371 (c)(1),
(2), (4) Date: Jul. 21, 2010

(87) PCT Pub. No.: WO2009/112306
PCT Pub. Date: Sep. 17, 2009

(65) Prior Publication Data
US 2010/0297828 A1  Nov. 25, 2010

(30) Foreign Application Priority Data
Mar. 11, 2008  (FR) ...................................... 08 51566

(51) Int. Cl.
*H01L 21/46* (2006.01)
(52) U.S. Cl. ................. 438/458; 438/977; 257/E21.568
(58) Field of Classification Search ............ 257/E21.568
See application file for complete search history.

(56) References Cited

U.S. PATENT DOCUMENTS

| | | | |
|---|---|---|---|
| 5,966,620 A | 10/1999 | Sakaguchi et al. | 438/455 |
| 6,524,935 B1 * | 2/2003 | Canaperi et al. | 438/478 |
| 7,056,815 B1 * | 6/2006 | Weng et al. | 438/518 |
| 7,531,428 B2 * | 5/2009 | Dupont | 438/458 |
| 2001/0029072 A1 | 10/2001 | Kuwahara et al. | 438/151 |
| 2006/0281280 A1 | 12/2006 | Endo et al. | 438/455 |
| 2007/0155134 A1 | 7/2007 | Nakai et al. | 438/471 |
| 2007/0218570 A1 | 9/2007 | Nakamura et al. | 438/5 |
| 2008/0124929 A1 * | 5/2008 | Okuda et al. | 438/692 |
| 2008/0128851 A1 * | 6/2008 | Aga et al. | 257/506 |
| 2009/0209085 A1 * | 8/2009 | Tamura et al. | 438/458 |

FOREIGN PATENT DOCUMENTS

| | | |
|---|---|---|
| EP | 0 843 344 B1 | 5/1998 |
| EP | 1 667 208 A1 | 6/2006 |
| EP | 1 777 735 A2 | 4/2007 |
| EP | 1 804 283 A1 | 7/2007 |
| WO | WO 03/060982 A2 | 7/2003 |

OTHER PUBLICATIONS

International Search Report, PCT/EP2009/050994, mailed Apr. 22, 2009.

* cited by examiner

*Primary Examiner* — Stephen W Smoot
(74) *Attorney, Agent, or Firm* — Winston & Strawn LLP

(57) ABSTRACT

A method for fabricating a substrate of the semiconductor on insulator type by forming an epitaxial layer of semiconducting material on a donor substrate having oxygen precipitates with a density of less than $10^{10}/cm^3$ or a mean size of less than 500 nm, forming an oxide layer on either a donor or receiver substrate, implanting atomic species in the donor substrate to form a weakened zone in the epitaxial layer, bonding the donor and receiver substrates together, with the oxide layer present at the bonding interface, fracturing the donor substrate in the weakened zone to transfer a layer of the donor substrate to the receiver substrate with the transferred layer including the epitaxial layer, and recycling the remainder of the donor substrate to form a receiver substrate for fabrication of a second semiconductor on insulator type substrate.

15 Claims, 4 Drawing Sheets

METHOD FOR FABRICATING A SEMICONDUCTOR ON INSULATOR TYPE SUBSTRATE

This application is a 371 filing of International Patent Application PCT/EP2009/050994 filed Jan. 29, 2009.

SCOPE OF THE INVENTION

The present invention relates to a method for fabricating a Semiconductor on Insulator type substrate.

BACKGROUND OF THE INVENTION

The invention is situated in the general context of fabrication of a Semiconductor on Insulator (SeOI) type substrate by means of the SmartCut™ method, and of recycling the remainder of the donor substrate.

The SmartCut™ method is described in detailed manner for example in U.S. Pat. No. 5,374,564. This method enables a layer to be transferred from a donor substrate to a receiver substrate.

With reference to FIG. 1, it should be recalled that it comprises the following steps:

1) Oxidation of the donor substrate 10 or receiver substrate 30 to form an oxide layer 20;
2) Ion implantation in the donor substrate 10 to form a weakened zone 12;
3) Bonding of the donor substrate 10 onto the receiver substrate 30, the oxide layer 20 being located at the interface;
4) Fracturing the donor substrate 10 in the weakened zone 12 and transfer of a layer 11 from the donor substrate 10 to the receiver substrate 30;
5) Finishing treatment of the SeOI 1 formed in this way.

It is advantageous to recycle the remainder 13 of the donor substrate to use the latter in a new implementation of the SmartCut™ method. After polishing, it can be re-used as donor substrate: this is then referred to as "top for top" recycling, or it can be re-used as receiver substrate, in which case "top for base" recycling is referred to.

Recycling in particular comprises polishing of at least one of the faces of the substrate to remove the material damaged by implantation and fracturing. The thickness removed may be a few microns.

It should be stipulated that the invention involves the latter case, i.e. recycling of the remainder of the donor substrate as receiver substrate. The donor substrate may not be "new"—it may in fact have been previously used as donor substrate and recycled as donor substrate, but a limited number of times so as not to be too damaged.

When the remainder of the donor substrate is recycled to constitute a new donor substrate, the succession of Smart-Cut™ cycles involving thermal treatments at medium (i.e. less than 1000° C.) or low (i.e. less than 600° C.) temperatures, in particular when performing oxidation and fracturing, does in fact generate defects in the substrate which may limit use thereof.

Recycling of the remainder of the donor substrate as receiver substrate on the other hand enables the substrate to be subjected to two SmartCut™ cycles only, the first as donor substrate and the second as recycled receiver substrate.

This recycling mode therefore enables the number of thermal treatments undergone by the substrate to be limited, thereby minimizing damage of the latter.

However, even in this case, on account of the thermal treatments it has undergone during implementation of the SmartCut™ method and depending on its initial properties, the recycled substrate may present denser and/or larger defects than those of the initial donor substrate. These defects are distributed in the volume of the material and do not necessarily propagate to the surface. The recycled substrate can therefore be of less good quality than the initial donor substrate.

These defects are referred to as Bulk Micro Defects (BMD). These defects correspond typically to oxygen precipitates within the substrate. Formation of these precipitates is induced by the thermal treatments undergone by the substrate and also depends on the initial properties of the material. More precisely, the density of BMD defects is considered to be linked to the temperature gradient applied, whereas the mean size of these defects is linked to the maximum treatment temperature.

However, depending on the intended use of the SeOI formed in this way, electronic component manufacturers define specifications imposing a maximum value for the BMD defect density and/or a maximum value for the size of these defects.

A first object of the invention is therefore to improve the quality of the recycled substrate. A second object of the invention is to enable a recycled substrate of required thickness to be obtained at the end of the polishing step which can remove a consequent material thickness. The invention further has the object of optimizing the quality of the SeOI on completion of the first cycle of SmartCut™.

SUMMARY OF THE INVENTION

According to the invention, a method for fabricating a semiconductor on insulator type substrate is proposed, comprising the following steps:

formation of an oxide layer on a donor substrate or a receiver substrate, implantation of atomic species in the donor substrate so as to form a weakened zone, bonding of the donor substrate onto the receiver substrate, the oxide layer being at the bonding interface, fracturing the donor substrate in the weakened zone and transferring a layer of the donor substrate to the receiver substrate, recycling of the remainder of the donor substrate to form a receiver substrate used for fabrication of a second semiconductor on insulator type substrate.

This method is characterized in that before the oxidation step, a layer of semiconducting material is formed on the donor substrate by epitaxy, that the weakened zone is formed in said epitaxied layer during the implantation step so that the transferred layer is an epitaxied semiconducting material layer, and that a donor substrate is chosen comprising oxygen precipitates with a density of less than $10^{10}/cm^3$ and/or a mean size of less than 500 nm.

According to a preferred embodiment, after recycling of the remainder of the donor substrate, the receiver substrate thereby obtained comprises a layer of epitaxied semiconducting material, the thickness of which is preferably greater than 100 nm.

In particularly advantageous manner, thermal treatment of the donor substrate is performed before epitaxy.

The thickness of the epitaxied silicon layer is preferably comprised between 0.5 and 8 μm.

According to a particular embodiment of the invention, the donor substrate comprises 2 to 40 ppm of diluted oxygen.

According to an alternative embodiment, the donor substrate comprises nitrogen atoms with a density preferably lower than $10^{15}$ atoms/cm$^3$.

The donor substrate can also comprise a layer of polycrystalline silicon and/or an oxide layer on the rear face thereof.

Recycling of the remainder of the donor substrate comprises polishing of the two faces of said remainder and/or of the side edge, or chemical mechanical polishing of the face of said remainder corresponding to the weakened zone.

The epitaxied layer advantageously comprises silicon, germanium and/or SiGe.

The invention also relates to a method for recycling the remainder of the donor substrate on completion of fabrication of a first semiconductor on insulator type substrate by the SmartCut™ method, the recycled substrate being used as receiver substrate in fabrication of a second semiconductor on insulator type substrate. This method is characterized in that when the first SeOI substrate is fabricated:

a donor substrate is chosen comprising oxygen precipitates with a density of less than $10^{13}/cm^3$ and/or a mean size of less than 500 nm, a layer of semiconducting material is formed by epitaxy on the donor substrate, the weakened zone is formed in said epitaxied layer in the implantation step.

The recycled substrate preferably comprises a layer of epitaxied semiconducting material, the thickness of which is preferably greater than 100 nm.

BRIEF DESCRIPTION OF THE DRAWINGS

Other features and advantages of the invention will become apparent from the following detailed description, with reference to the appended drawings in which.

DETAILED DESCRIPTION OF THE INVENTION

Figure 1:
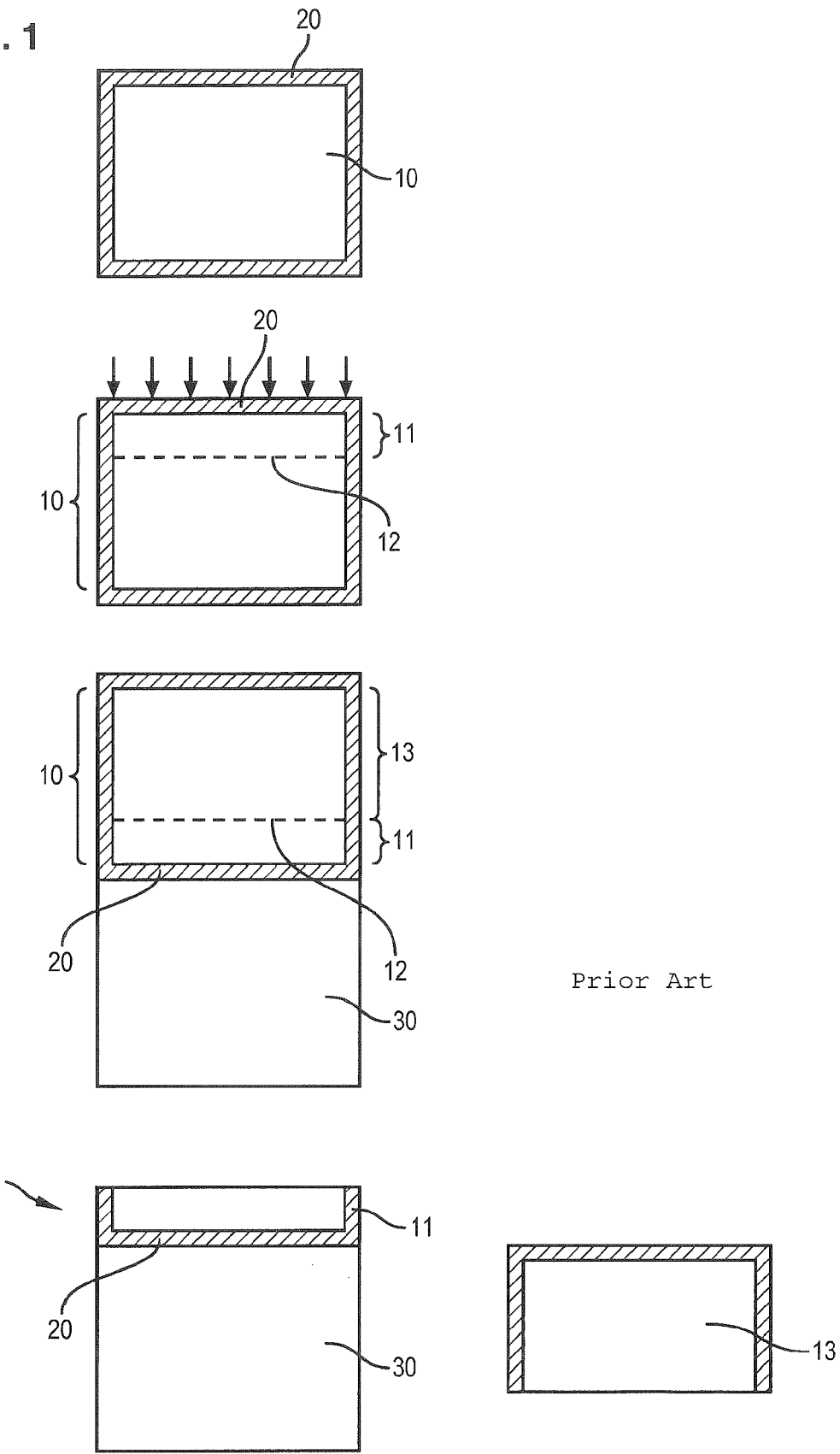
FIG. 1 illustrates the different steps of the SmartCut™ method.
Figure 2:
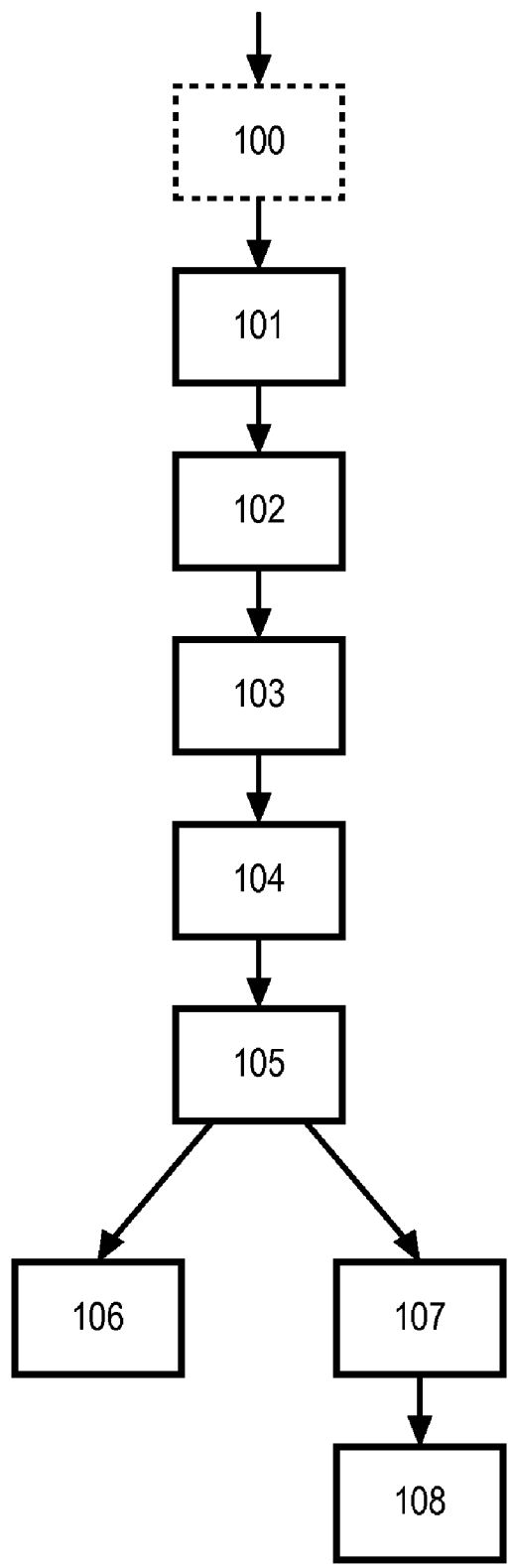
FIG. 2 is a flowchart illustrating the different steps of the method according to the invention.

With reference to the flowchart of FIG. 2, the method comprises the following steps, which will be explained in detail hereunder:

100) optionally, annealing of donor substrate 10;

101) growth by epitaxy of a layer 14 of semiconducting material on donor substrate 10;

102) formation of an oxide layer 20 on donor substrate 10 or receiver substrate 30;

103) implantation of atomic species in epitaxied layer 14;

104) bonding of donor substrate 10 on receiver substrate 30;

105) fracturing of donor substrate and transfer of a layer 140 of donor substrate 10, 14 to receiver substrate 30;

106) finishing of the first SeOI 1 formed in this way;

107) polishing of remainder 2 of donor substrate and obtaining a recycled substrate 40;

108) second SmartCut™ cycle: resumption of steps 100) to 107) with a new donor substrate 50 and using recycled substrate 40 as receiver substrate.

Step 100—Annealing

This step is optional.

It comprises application of annealing to donor substrate 10.

The effect of this anneal is to improve the quality of a superficial layer of the donor substrate, thereby enabling the thickness of good quality silicon to be increased and fostering growth of an epitaxied layer of good quality.

The conditions of this anneal are typically a temperature comprised between 1000° C. and 1360° C. and an anneal time of about 30 seconds to 30 minutes. The thickness of the superficial layer of the donor substrate of improved quality can be up to a few microns.

Step 101—Epitaxy

Figure 3A:
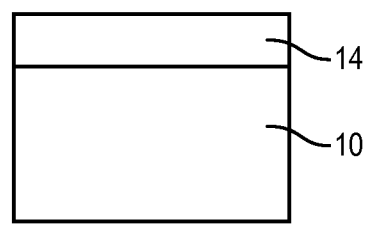
FIGS. 3A to 3F represent formation of an SeOI and recycling of the donor substrate according to the invention in schematic form.

With reference to FIG. 3A, epitaxy is performed on donor substrate 10 to make a layer 14 of semiconducting material grow with a thickness comprised between 0.5 and 8 microns, preferably between 2 and 5 microns.

The material of epitaxied layer 14 is for example silicon, germanium, or a SiGe compound. Layer 14 may not be composed of a single material, but can be formed by superposition of two or more layers of semiconducting materials.

In the remainder of the text, a silicon layer 14 will be taken, but the invention applies to the other possibilities that have just been mentioned.

What is meant by epitaxy is any technique enabling monocrystalline silicon to be grown, such as chemical vapor deposition (CVD) epitaxy, low pressure chemical vapor deposition (LPCVD) epitaxy, molecular beam (MBE) epitaxy, organo-metallic vapor deposition (MOCVD) epitaxy . . . .

Epitaxied layer 14 can optionally be weakly or strongly P-doped or N-doped or present a P/N junction, for example an N-doped top part and a P-doped bottom part.

Step 102—Oxidation

Oxidation can be performed on donor substrate 10, 14 or on receiver substrate 30. This may involve thermal oxidation or deposition of an oxide. Oxidation generates an oxide layer over the whole surface of the substrate, i.e. the front face, rear face and side faces.

Figure 3B:
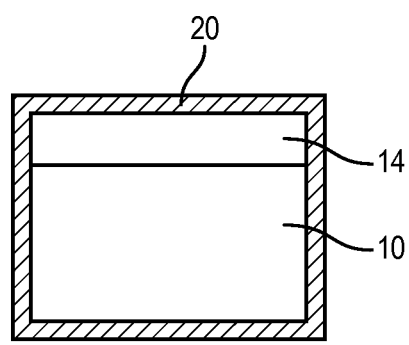

Preferably, as illustrated in FIG. 3B, oxide layer 20 is formed on donor substrate 10 covered by epitaxied layer 14, which enables the bonding interface to be moved away from the SeOI active layer.

Step 103—Implantation

Figure 3C:
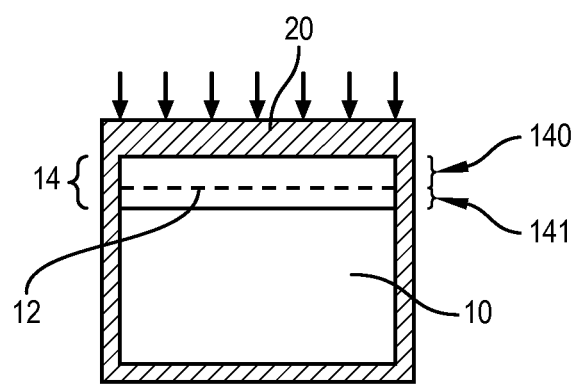

With reference to FIG. 3C, implantation of atomic species is performed in the thickness of epitaxied layer 14. Weakened zone 12 thus formed is therefore in the thickness of this layer.

Layer 140 which will be transferred is thereby made from epitaxied silicon of very good crystalline quality. An SeOI of very good quality will therefore be obtained.

Remainder 2 of the donor substrate will moreover comprise a residual layer 141 of epitaxied silicon after fracturing.

Step 104—Bonding

Figure 3D:
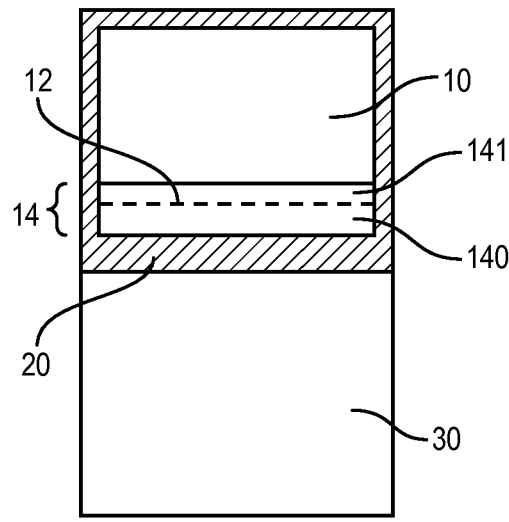

Donor substrate 10, 14 and receiver substrate 30 are bonded for example by molecular bonding, oxide layer 20 being at the interface between the two substrates. This step is illustrated in FIG. 3D.

Annealing can be applied so as to strengthen the bonding energy.

Step 105—Fracturing

Fracturing of donor substrate 10 and epitaxied layer 14 along weakened zone 12 is triggered by applying a thermal treatment and/or a mechanical force.

Figure 3E:
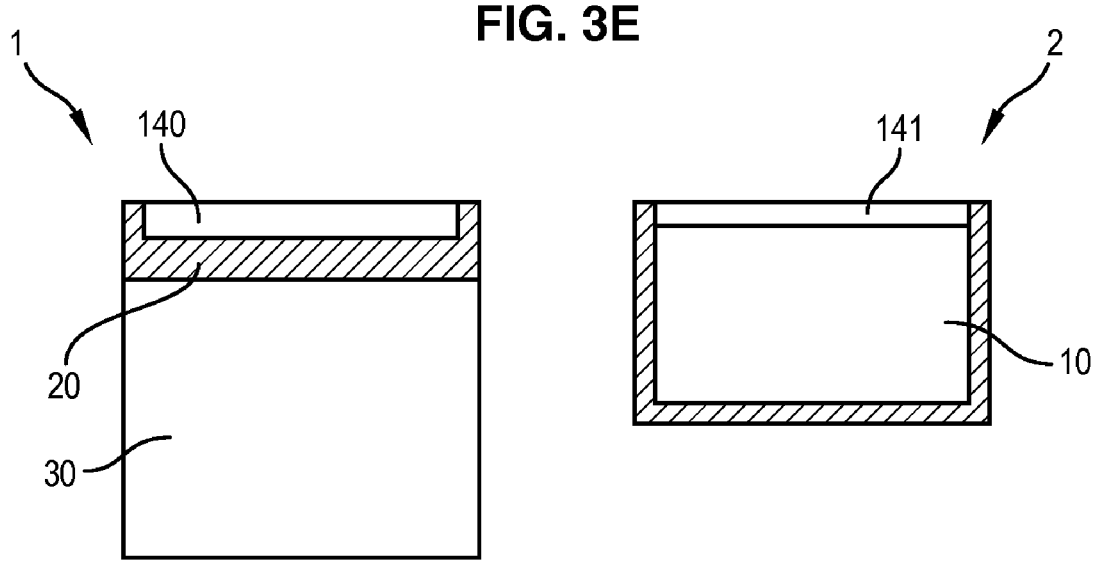

With reference to FIG. 3E, a layer 140 of epitaxied silicon is then transferred onto receiver substrate 30, whereas the remainder of the donor substrate is detached from the SOI thus formed.

It should be recalled that the weakened zone having been formed in the thickness of epitaxied layer 14, transferred layer 140 is formed by epitaxied silicon, whereas remainder 2 of the donor substrate comprises initial donor substrate 10 covered by a residual layer 141 of epitaxied silicon.

A peripheral crown is moreover not transferred, which results in a salient step at the periphery of the remainder.

Step 106—Finishing of the First SEOI

The first SeOI 1 obtained is then subjected to finishing steps designed to make it proper for the scheduled use. These treatments are typically rapid anneals, known under the abbreviation RTA (Rapid Thermal Anneal) or long anneals at high temperature (about 1200° C.).

The SeOI 1 obtained in this way presents an active layer 140 formed by epitaxy, and therefore of very good crystalline quality.

Step 107—Recycling of the Remainder of the Donor Substrate

The purpose of recycling is to eliminate the zones damaged by implantation and fracturing or the residual zones such as the step mentioned above from remainder 2, and to bring it to the required thickness to make a receiver substrate 40 from it.

Recycling can be performed by means of different techniques which can be combined if required.

According to a first possibility, a double side polish (designated by the abbreviation DSP) is performed either simultaneously on both faces or sequentially, i.e. on one of the faces and then on the other (designated by the abbreviation SDSP or sequential DSP).

According to a second embodiment, only polishing of the face corresponding to the weakened zone is performed; chemical mechanical polishing designated by the abbreviation CMP is used for this purpose.

Other alternative embodiments consist in performing polishing of edge-polish type and/or etchings. Polishing called edge-polish is polishing by CMP of the bevel or of both bevels (top and bottom) which all substrates present on their periphery and/or of the edge of the substrate.

In all cases, the recycling step results in a significant thickness of remainder 2 being removed, typically a few hundred nanometers or a few microns.

The fact that remainder 2 comprises a part of the thickness of epitaxied layer 14 increases its thickness compared with that of the initial donor substrate. This additional thickness constitutes an additional material reserve which compensates the consumption of material when polishing is performed.

Figure 3F:
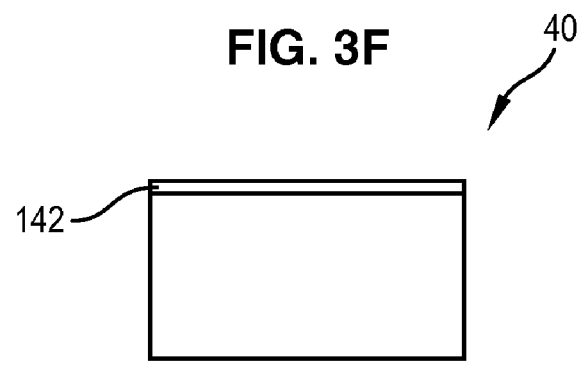

The residual thickness of epitaxied silicon can be entirely or partially consumed during recycling comprising polishing. The latter case is illustrated in FIG. 3F where the recycled substrate 40 presents a fine residual layer 142 of epitaxied silicon at its surface.

The thickness of the residual layer 142 on the recycled substrate 40 is preferably greater than 100 nm.

Step 108—Second SmartCut™ Cycle

The second SmartCut™ cycle is implemented as in steps 100) to 107) described above, using for this purpose a new donor substrate and using recycled substrate 40 as receiver substrate.

It can be noted that if it is the donor substrate that undergoes oxidation, then the recycled substrate does not undergo oxidation in the second SmartCut™ cycle.

If on the other hand it is the receiver substrate that undergoes oxidation, then the recycled substrate undergoes oxidation in the second SmartCut™ but did not undergo oxidation in step 102) of the first cycle.

In other words, the recycled substrate only undergoes a single oxidation, either as initial donor substrate or as recycled receiver substrate.

The thermal treatments can in this way be limited, which would not be the case for "top for top" recycling where the recycled substrate would undergo two oxidations: the first as initial donor substrate, and the second as recycled donor substrate.

In the case where a thickness 142 of epitaxied silicon still remains on the recycled substrate 40, it is the face presenting the epitaxied silicon which is at the bonding interface with the new donor substrate when the second SmartCut™ cycle is performed.

The second SeOI obtained thereby presents a silicon layer of very good quality under the oxide layer. Such a configuration is particularly advantageous when fabricating SOI with an ultra thin oxide layer (i.e. a thickness of less than 50 nm). Such SeOI are known in the trade as UT-BOX (Ultra Thin Buried Oxide).

The thickness of silicon epitaxied in step 101) therefore results from a trade-off between the required surface quality of the recycled substrate (i.e. the thickness of silicon of very good quality required at the surface of the recycled substrate), the final thickness of the recycled substrate and the manufacturing costs of this epitaxied layer.

An alternative to reduce the thickness epitaxied in step 101) and to economize the epitaxied silicon consumed during polishing consists in only forming by epitaxy one layer with a thickness substantially equal to that of the layer to be transferred onto the donor substrate to form the first SeOI, in polishing the remainder of the donor substrate and in then growing a silicon layer, at the surface of the latter by epitaxy, of the thickness required for use thereof as recycled receiver substrate.

The thickness of the recycled substrate can moreover be adjusted by providing a layer of polycrystalline silicon on the rear face of the initial donor substrate (i.e. the face opposite the face on which the silicon layer is grown by epitaxy). The thickness of this layer is typically about 1 to 2 microns. This layer is consumed in double-side polishing enabling a larger thickness of the remainder of the donor substrate to be kept.

Alternatively, the initial donor substrate can comprise an oxide layer, on its rear face, deposited by CVD (chemical vapor deposition). This oxide layer protects the rear face of the substrate or, if this is the case, the polycrystalline silicon layer. It also enables a larger thickness of the initial donor substrate to be kept.

Initial Donor Substrate Quality

The initial donor substrate is moreover advantageously chosen such as to have a BMD density and/or mean size lower than a given limit.

Typically, the defect density is less than $10^{10}/cm^3$, preferably comprised between $10^5$ and $10^{10}/cm^3$, or even between $10^7$ and $5*10^9/cm^3$, whereas the mean size of the defects is less than 500 nm.

In this way, even if these BMD type defects form in the donor substrate during the two phases of the method (the 2 stages of life of the donor substrate, i.e. donor substrate then recycled receiver substrate), they can be compensated by a better initial quality.

In particular, the final surface quality is independent from the BMD due to the epitaxied layer which does not contain any.

The initial donor substrate can comprise oxygen in diluted form (i.e. not precipitated), with a content comprised between 2 and 40 ppm, which corresponds approximately to $10^{17}$ and $2*10^{18}$ atoms/cm$^3$ depending on the conversion calculation applied.

Optionally, the initial donor substrate can further contain nitrogen atoms—typically with a density of less than $10^{15}$ atoms/cm$^3$. These nitrogen atoms have the effect of causing precipitation of oxygen in the form of smaller and more numerous BMD. The atoms are incorporated in the donor substrate material in solid or gaseous phase when growth of the ingot takes place.

What is claimed is:

1. A method for fabricating a semiconductor on insulator type substrate, which comprises:

forming an epitaxial layer of semiconducting material on a face of donor substrate that contains oxygen precipitates having a density of less than $10^{10}/cm^3$ or a mean size of less than 500 nm, forming an oxide layer on either the donor substrate or a receiver substrate, implanting atomic species in the donor substrate to form a weakened zone in the epitaxial layer, bonding the donor and receiver substrates together to provide the oxide layer present at the bonding interface between the substrates, fracturing the donor substrate in the weakened zone to transfer a layer of the donor substrate to the receiver substrate with the transferred layer including at least part of the epitaxial layer, and recycling the remainder of the donor substrate as a receiver substrate for fabrication of a second semiconductor on insulator type substrate.

2. The method according to claim 1, wherein the remainder of the donor substrate which is recycled as the receiver substrate includes at least part of the epitaxial layer.

3. The method according to claim 2, wherein the epitaxial layer on the recycled receiver substrate has a thickness that is greater than 100 nm.

4. The method according to claim 1, which further comprises conducting a thermal treatment of the donor substrate before the forming of the eptiaxial layer thereon.

5. The method according to claim 1, wherein the epitaxial layer is a layer of silicon having a thickness of between 0.5 and 8 μm.

6. The method according to claim 1, wherein the donor substrate comprises 2 to 40 ppm of diluted oxygen.

7. The method according to claim 1, wherein the donor substrate comprises nitrogen atoms.

8. The method according to claim 7, wherein the nitrogen atoms have a density that is less than $10^{15}$ atoms/$cm^3$.

9. The method according to claim 1, wherein the donor substrate comprises a polycrystalline silicon layer or an oxide layer on a rear face opposite the face that includes the epitaxial layer.

10. The method according to claim 1, wherein the recycling of the remainder of the donor substrate includes polishing of two faces of the remainder or of a side edge thereof.

11. The method according to claim 1, wherein the recycling of the remainder of the donor substrate includes chemical mechanical polishing of a face of the remainder that includes the fractured weakened zone.

12. The method according to claim 1, wherein the epitaxied layer comprises silicon, germanium or SiGe.

13. In a method for recycling a donor substrate after transfer of a layer to a receiver substrate to form a first semiconductor on insulator type substrate, with the recycled donor substrate being used as receiver substrate for forming a second semiconductor on insulator type substrate, the improvement which comprises:

selecting a donor substrate that contains oxygen precipitates having a density of less than $10^{10}/cm^3$ or a mean size of less than 500 nm, providing an epitaxial layer of semiconducting material on the donor substrate, and forming a weakened zone in the epitaxial layer during an implantation step.

14. The method of claim 13, wherein the recycled donor substrate includes at least part of the epitaxial layer.

15. The method of claim 14, wherein the epitaxial layer on the recycled donor substrate has a thickness that is greater than 100 nm.

* * * * *